United States Patent [19]

Marzinotto

[11] Patent Number: 4,799,722
[45] Date of Patent: Jan. 24, 1989

[54] APPARATUS FOR TRANSPORTING PERFORATED OBJECTS

[75] Inventor: Francesco Marzinotto, Zurich, Switzerland

[73] Assignee: Ciba-Giegy AG, Basel, Switzerland

[21] Appl. No.: 118,935

[22] Filed: Nov. 10, 1987

[30] Foreign Application Priority Data

Nov. 10, 1986 [CH] Switzerland .......................... 4480/86

[51] Int. Cl.⁴ .......................... B25J 15/06; B66C 1/02
[52] U.S. Cl. ........................................ 294/64.1; 269/21
[58] Field of Search ................. 294/64.1, 65; 248/362, 248/363; 269/21

[56] References Cited

U.S. PATENT DOCUMENTS 2,953,808  9/1960  Carmack .................... 294/64.1 X

FOREIGN PATENT DOCUMENTS 2184072  5/1973  France .
57-145723  of 1982  Japan .

Primary Examiner—Johnny D. Cherry
Assistant Examiner—Gary C. Hoge
Attorney, Agent, or Firm—Burns, Doane, Swecker & Mathis

[57] ABSTRACT

A vacuum-operated gripper head for transporting perforated objects. The gripper head includes a plurality of naps which penetrate into the perforations of the object to be moved in order to seal the perforations. Thus, only the topmost perforated object of a stack of such objects is removed by the gripper head.

27 Claims, 2 Drawing Sheets

FIG. 3 (III-III)
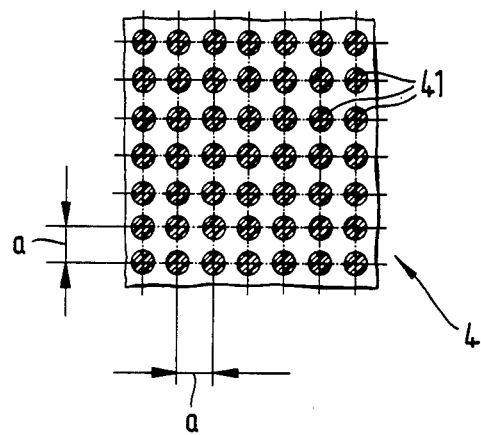
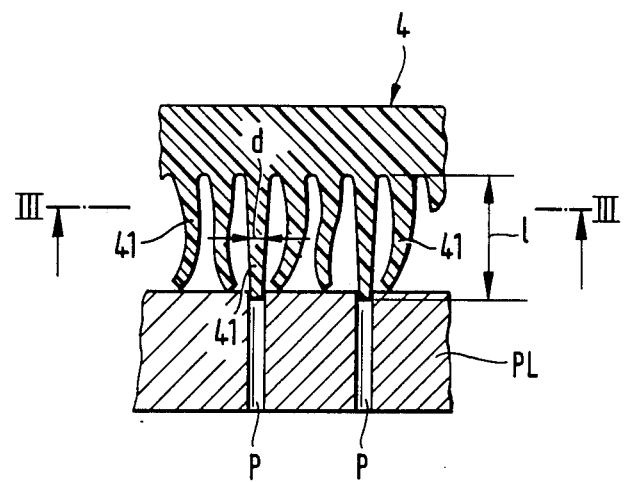
FIG. 2 (II)

APPARATUS FOR TRANSPORTING PERFORATED OBJECTS

CROSS-REFERENCE TO RELATED APPLICATION

This application is related to a co-pending application entitled "Method and Apparatus for Transporting Perforated Objects" filed Nov. 10, 1987, and assigned Ser. No. 07/118934

BACKGROUND OF THE INVENTION

The present invention relates to a transport apparatus for perforated objects such as perforated circuit boards. More particularly, the present invention relates to a transport apparatus for removing perforated objects from a stack of such objects.

Frequently in the electronics industry, a circuit board must be removed from a stack of such boards and conveyed to a work station for further operations or installation. Automated devices are normally employed for this purpose. One type of automated device used for this purpose includes a vacuum operated gripper head which removes the top circuit board from the stack by means of suction. In the case of perforated circuit boards, however, difficulties often arise due to the tendency of such suction-operated gripper heads to lift more than one circuit board from the stack.

It is sometimes possible to reduce the tendency of the gripper head to lift more than one object by adjusting the suction power of the gripper head so that the weight of only a single circuit board will be supported. Adjustments of this type, however, must be highly accurate and, when possible, require expensive control devices Furthermore, the transport device would require delicate adjustment whenever the type of circuit board being transported is changed.

U.S. Pat. No. 3,602,543 issued Aug. 31, 1971, relates to a vacuum-operated lifting device for lifting cargo having a surface with a hole therethrough. Within a suction cup a plate is provided which overlies the hole, and, when the suction cup is applied to the cargo, the end plate causes a valve stem associated therewith to open a valve to a vacuum source. The plate has a check design of ribs forming a large number of open bottom chambers and a conduit leading form each chamber to the suction cup carrier The conduits are of such a size that they permit suction of those chambers closed by the end of the cargo and prevent large quantities of air from flowing through those conduits in communication with the cargo hole.

This device is suitable for use with loads having one, or a few, relatively large openings A device of this type, however, is not suitable for use with circuit boards which have a relatively large number of small perforations. Furthermore, a device of this type is difficult to construct properly and relatively expensive.

U.S. Pat. No. 2,841,433 relates to a vacuum-operated gripper device for lifting boxes, cartons, or the like from pallets or conveyor belts. A row of curtain-like flaps having sealing elements provided at their end portions is provided. This gripper, however, is not suitable for use with circuit boards.

Other gripper devices are disclosed, for example, in U.S. Pat. No. 3,523,707, Japanese Laid-Open Patent Publication No. 57-14723 and French Patent No. 2,184,072. Each of these gripper devices are divided into a plurality of chambers. A relatively complex distributor system is provided for the vacuum source to prevent excessive loss of suction due to openings in the object being moved. These grippers are quite complex and expensive, and are not well-suited for use in transporting perforated circuit boards.

The present invention is an improvement over previous suction-operated transport devices. More particularly, the present invention simply and economically overcomes the undesirable tendency of known transport devices of removing more than a single circuit board from the top of a stack of perforated circuit boards.

BRIEF SUMMARY OF THE INVENTION

Briefly, the present invention overcomes the shortcomings of previous vacuum-operated gripper devices by effectively sealing the perforations of the topmost object on a stack of such objects. Thus, the suction effect from the gripper is not applied through the perforations to other objects on the stack, and only the topmost object will be removed from the stack.

A plurality of sealing naps is provided in the gripper head. These sealing naps are sized such that they enter the perforations in the object to be transported Thus, the suction effect of the gripper head is limited to the topmost object on the stack.

BRIEF DESCRIPTION OF THE DRAWINGS

The features, objects, and advantages of the present invention will become apparent from the following detailed description when read in light of the accompanying drawings, in which:

FIG. 2 illustrates a cross-sectional view of a portion of the gripper head of FIG. 1; and FIG. 3 illustrates a bottom view of a portion of the gripper head of FIG. 1.

DETAILED DESCRIPTION OF THE PREFERRED EMBODIMENT

Figure 1:
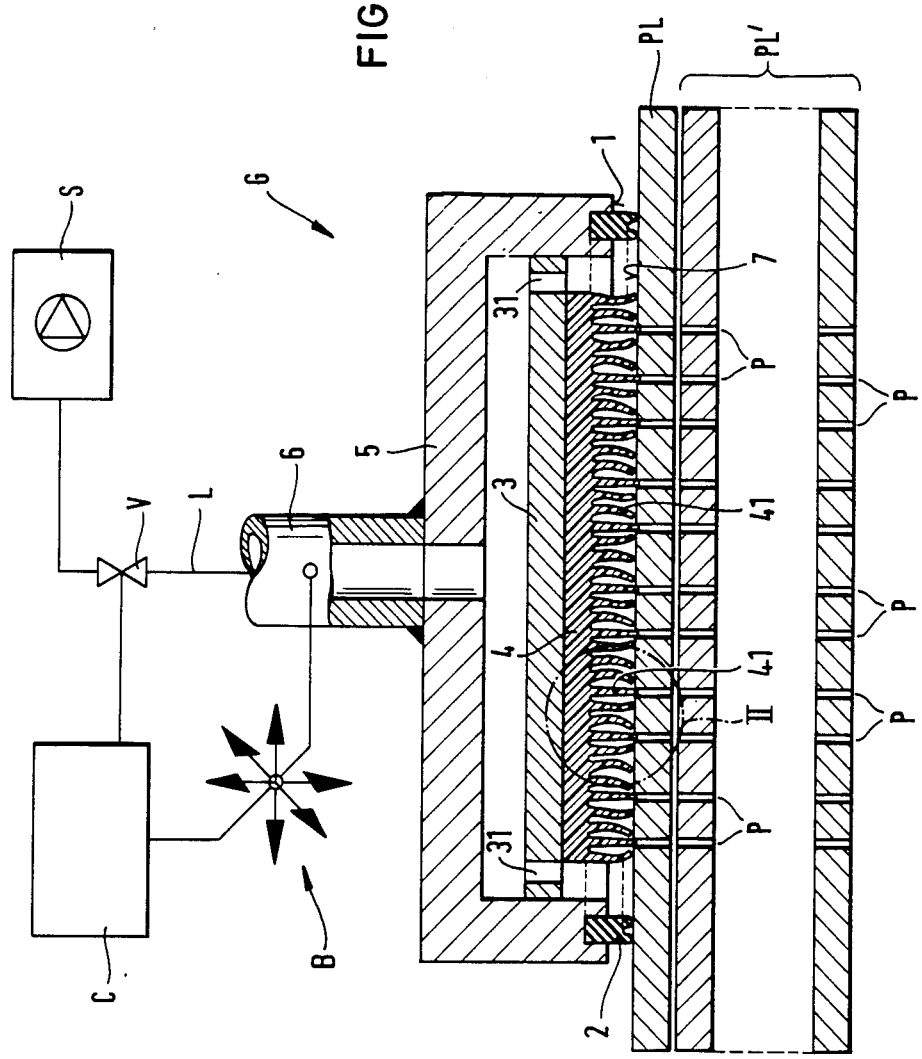
FIG. 1 is a schematic view of one embodiment of the present invention, including a detailed sectional view of a gripper head.

Referring to FIG. 1, a preferred embodiment of the transport device includes a gripper head G and a conventional suction device S connected with the gripper head G by a valved flexible vacuum line L. The position of the gripper head is preferably determined by a standard positioning device such as a robotic arm, indicated generally in FIG. 1 by directional arrows B. Of course, other positioning devices may be employed A conventional control device C, such as a programmable controller or the like, is preferably provided to control operation of the valve V in vacuum line L and the positioning device B.

The gripper head G may include a housing 5 having a generally U-shaped cross-section. The housing 5 includes a rim 1 wherein a circumferential elastic sealing lip 2 is provided. A support plate 3 is arranged within the housing 5 for supporting mat 4 having a plurality of elastic naps 41. A plurality of air passage orifices 31 are provided around the periphery of the support plate 3. The housing 5 also includes a connector 6 for attaching the gripper head to the suction device S through the flexible vacuum hose L.

The napped mat 4 preferably is formed of an elastic material. The portion of the mat which faces the object to be transported includes a plurality of bristle-like elastic naps 41. In the preferred embodiment, the length and diameter of the naps 41 is chosen in accordance with the features of the circuit board to be transported. For example, the length 1 (see FIG. 2) of the naps 41 may be approximately 3 to 8 millimeters, and preferably about 4 to 6 millimeters. The length 1 should be chosen so that the naps 41 extend at least to the plane 7 defined by the circumferential sealing lip 2. The mean diameter d of the naps 41 may be approximately 0.4 to 1.5 millimeters, and preferably about 0.8 to 1.2 millimeters. The distance "a" between adjacent naps 41 (see FIG. 3) may be chosen so that there are approximately 20 to 150 naps per square centimeter, and preferably 50 to 100 naps per square centimeter.

As illustrated in FIG. 1, a stack includes a plurality of perforated electric circuit boards including a topmost circuit board PL and a plurality of addition circuit boards PL'. The circuit boards each include a number of perforations P. The pattern of the perforations on the circuit boards is determined by the conductor pattern on the circuit board.

In operation, the gripper head G is placed upon the uppermost circuit board PL of the stack by the positioning device. The suction device S may then be actuated, or the shut-off valve V may be opened, to produce a reduced pressure in the gripper head housing 5, causing the uppermost circuit board to be held to the gripper head G. The naps 41 penetrate into the perforations P of the uppermost circuit board PL to effectively seal them. Thus, suction is limited to the uppermost circuit board PL and is not applied to the remaining circuit boards PL'. Accordingly, only a single circuit board is removed from the stack.

The principles, preferred embodiments and modes of operation of the present invention have been described in the foregoing specification. The invention which is intended to be protected herein, however, is not to be construed as being limited to the particular forms disclosed, since these are to be regarded as illustrative rather than restrictive. Variations and changes may be made by those skilled in the art without departing from the spirit of the invention. For example, the invention has been described in connection with the transport of perforated electric circuit boards, but could be adapted for use with other perforated objects.

What is claimed is:

1. A transport device for transporting perforated objects, comprising:
   a gripper head having a housing and including a sealing device having a base and a plurality of naps which extend from said base;
   suction means connected with said gripper head for providing a reduced pressure in said housing;
   means for adjusting the position of said gripper head; and
   means for controlling the operation of said suction means and said positioning means, said control means operable to place said gripper head against a perforated object and to actuate said suction means to hold said perforated object against said gripper head;
   said naps being sized to penetrate into perforations of said perforated object and effectively seal said perforations.

2. The transport device of claim 1, wherein said housing has a generally U-shaped cross-section and said sealing device is positioned across an open side of said housing.

3. The transport device of claim 2, wherein said naps extend beyond the open side of said housing.

4. The apparatus of claim 1, wherein the diameter of said naps tapers away from said base.

5. The transport device of claim 4, wherein the mean diameter of said tapered naps is between approximately 0.4 millimeters and 1.5 millimeters.

6. The transport device of claim 5, wherein said tapered naps have a length between approximately 3 millimeters and 8 millimeters.

7. The transport device of claim 5, wherein said tapered naps have a length between approximately 4 millimeters and 6 millimeters.

8. The transport device of claim 4, wherein the mean diameter of said tapered naps is between approximately 0.8 millimeters and 1.2 millimeters.

9. The transport device of claim 8, wherein said tapered naps have a length between approximately 3 millimeters and 8 millimeters.

10. The transport device of claim 8, wherein said tapered naps have a length between approximately 4 millimeters and 6 millimeters.

11. The transport device of claim 3, wherein said tapered naps have a length between approximately 3 millimeters and 8 millimeters.

12. The transport device of claim 3, wherein said tapered naps have a length between approximately 4 millimeters and 6 millimeters.

13. The transport device of claim 2, wherein the open side of said housing is provided with a sealing lip.

14. The transport device of claim 1, wherein said sealing device includes a plurality of naps formed on an elastic mat, said elastic mat being secured to a support.

15. The transport device of claim 14, wherein a plurality of air passages are provided between said support and said housing.

16. The apparatus of claim 1, wherein approximately 20 to 150 naps per square centimeter are provided on said sealing device.

17. The apparatus of claim 16, wherein the mean diameter of said tapered naps is between approximately 0.8 millimeters and 1.2 millimeters.

18. The apparatus of claim 17, wherein said tapered naps have a length between approximately 4 millimeters and 6 millimeters.

19. A gripper head used in a vacuum operated transport device for transporting perforated objects, comprising:
    a base plate;
    a plurality of side walls attached to said base plate to define a housing having a generally U-shaped cross-section;
    a sealing device mounted in said housing and including a base and a plurality of naps which extend from said base, said naps being sized to penetrate into the perforations of said perforated object and effectively sell said perforations.

20. The gripper head of claim 19, wherein said naps extend beyond an open side of said housing.

21. The gripper head of claim 19, wherein the diameter of said naps tapers away from said base.

22. The gripper head of claim 21, wherein said tapered naps have a length between approximately 4 millimeters and 6 millimeters.

23. The gripper head of claim 22, wherein the mean diameter of said tapered naps is between approximately 0.8 millimeters and 1.2 millimeters.

24. The gripper head of claim 16, wherein approximately 20 to 150 naps per square centimeter are provided on said sealing device.

25. The gripper head of claim 21, wherein the mean diameter of said tapered naps is between approximately 0.8 millimeters and 1.2 millimeters.

26. The gripper head of claim 25, wherein approximately 20 to 150 naps per square centimeter are provided on said sealing device.

27. The gripper head of claim 21, wherein approximately 20 to 150 naps per square centimeter are provided on said sealing device.

* * * * *